(12) United States Patent  (10) Patent No.: US 8,368,404 B2
Wakimoto et al.  (45) Date of Patent: Feb. 5, 2013

(54) DISCHARGE AMOUNT MEASURING DEVICE AND METHOD FOR ROTATIONAL ELECTRIC MACHINE

(75) Inventors: Toru Wakimoto, Chiryu (JP); Yoshimitsu Takahashi, Chiryu (JP); Shinji Kouda, Kariya (JP)

(73) Assignees: Nippon Soken, Inc., Nishio (JP); DENSO CORPORATION, Kariya (JP)

( * ) Notice: Subject to any disclaimer, the term of this patent is extended or adjusted under 35 U.S.C. 154(b) by 484 days.

(21) Appl. No.: 12/768,080

(22) Filed: Apr. 27, 2010

(65) Prior Publication Data

US 2010/0271002 A1  Oct. 28, 2010

(30) Foreign Application Priority Data

Apr. 27, 2009 (JP) ................................. 2009-108177

(51) Int. Cl.
*G01R 31/08* (2006.01)
*G01R 31/12* (2006.01)
*H01H 9/50* (2006.01)

(52) U.S. Cl. ... 324/536; 324/530; 324/500; 324/765.01; 324/546; 324/551; 324/601

(58) Field of Classification Search ............. 324/765.01, 324/546, 551, 601, 536, 530, 500
See application file for complete search history.

(56) References Cited

U.S. PATENT DOCUMENTS

| | | | | |
|---|---|---|---|---|
| 2,003,681 A | * | 6/1935 | Doyle | 374/166 |
| 2,762,963 A | * | 9/1956 | Lucks et al. | 363/94 |
| 2,772,395 A | * | 11/1956 | Runaldue et al. | 324/714 |
| 2,899,141 A | * | 8/1959 | Harmon et al. | 242/431 |
| 3,727,133 A | * | 4/1973 | Marvin et al. | 324/765.01 |
| 3,753,087 A | * | 8/1973 | Tan | 324/523 |
| 3,896,376 A | * | 7/1975 | Sinniger | 324/765.01 |
| 4,199,718 A | * | 4/1980 | Ikeda et al. | 324/765.01 |
| 4,211,973 A | * | 7/1980 | Sato et al. | 324/765.01 |
| 4,356,443 A | * | 10/1982 | Emery | 324/546 |
| 4,377,784 A | * | 3/1983 | Saito et al. | 324/765.01 |

(Continued)

FOREIGN PATENT DOCUMENTS

| | | |
|---|---|---|
| JP | 1-191072 | 8/1989 |
| JP | 4-80777 | 3/1992 |

(Continued)

OTHER PUBLICATIONS

"IEEE Guide: Test Procedures for Direct-Current Machines", Rotating Machinery Committee of the IEEE Power Engineering Society, IEEE Std 113—1985, 1985, pp. 7-39.*

(Continued)

*Primary Examiner* — Patrick Assouad
*Assistant Examiner* — Lamarr Brown
(74) *Attorney, Agent, or Firm* — Nixon & Vanderhye PC

(57) ABSTRACT

A discharge amount measuring device includes a power source, first and second sensors, a calibration wire, and a measuring portion. The power source applies a voltage to a coil of a rotational electric machine. The first sensor detects a current flowing through the coil. The calibration wire has an end connected to the coil. The second sensor detects a current flowing through the calibration wire. The measuring portion forms a calibration line based on a first waveform detected by the first sensor and a second waveform detected by the second sensor. The measuring portion calculates a discharge amount based on the calibration line.

9 Claims, 7 Drawing Sheets

U.S. PATENT DOCUMENTS

| | | | |
|---|---|---|---|
| 4,651,086 A * | 3/1987 | Domenichini et al. | 324/715 |
| 4,849,690 A * | 7/1989 | Hughes | 324/765.01 |
| 4,851,761 A * | 7/1989 | Matsuno | 324/509 |
| 4,990,860 A * | 2/1991 | Peterson | 324/726 |
| 5,252,915 A * | 10/1993 | Sedding et al. | 324/765.01 |
| 5,283,527 A * | 2/1994 | DeBiasi | 324/391 |
| 5,309,089 A * | 5/1994 | Kawamura | 324/656 |
| 5,448,175 A * | 9/1995 | Nishibe et al. | 324/546 |
| 5,469,067 A * | 11/1995 | Endoh et al. | 324/551 |
| 5,481,199 A * | 1/1996 | Anderson et al. | 324/705 |
| 6,270,178 B1 | 8/2001 | Wada et al. | 347/7 |
| 6,590,312 B1 * | 7/2003 | Seguchi et al. | 310/266 |
| 7,135,793 B2 * | 11/2006 | Seguchi et al. | 310/71 |
| 8,054,013 B2 * | 11/2011 | Oyobe et al. | 318/139 |
| 8,198,902 B2 * | 6/2012 | Kawamura | 324/551 |
| 2002/0033703 A1 * | 3/2002 | Yu et al. | 324/551 |
| 2002/0196031 A1 * | 12/2002 | Blades | 324/536 |
| 2005/0218906 A1 * | 10/2005 | Younsi et al. | 324/551 |
| 2005/0218907 A1 * | 10/2005 | Lee et al. | 324/551 |
| 2005/0248361 A1 * | 11/2005 | O'Gorman et al. | 324/772 |
| 2005/0253466 A1 * | 11/2005 | Seguchi et al. | 310/71 |
| 2006/0022679 A1 * | 2/2006 | Obata et al. | 324/551 |
| 2006/0103417 A1 * | 5/2006 | Larminat et al. | 324/770 |
| 2006/0158197 A1 * | 7/2006 | Horikoshi et al. | 324/551 |
| 2006/0186892 A1 * | 8/2006 | Hiramatsu et al. | 324/500 |
| 2006/0186914 A1 * | 8/2006 | Ho | 324/772 |
| 2008/0174320 A1 * | 7/2008 | Smith et al. | 324/551 |
| 2008/0309351 A1 * | 12/2008 | Stewart et al. | 324/551 |
| 2008/0309366 A1 * | 12/2008 | Zhou et al. | 324/772 |
| 2009/0009180 A1 * | 1/2009 | Varghai et al. | 324/521 |
| 2009/0179605 A1 * | 7/2009 | Kanekawa et al. | 318/490 |
| 2009/0251154 A1 * | 10/2009 | Lindsey | 324/551 |
| 2010/0027305 A1 * | 2/2010 | Oyobe et al. | 363/131 |
| 2010/0045335 A1 * | 2/2010 | Cawthorne et al. | 324/772 |
| 2010/0090708 A1 * | 4/2010 | Kaneko et al. | 324/551 |
| 2010/0114509 A1 * | 5/2010 | Montanari et al. | 702/58 |
| 2010/0259275 A1 * | 10/2010 | Grieshaber et al. | 324/522 |
| 2010/0277199 A1 * | 11/2010 | Cusido I Roura et al. | 324/765.01 |
| 2010/0295551 A1 * | 11/2010 | Holzl | 324/500 |
| 2011/0006802 A1 * | 1/2011 | Younsi et al. | 324/765.01 |
| 2011/0181296 A1 * | 7/2011 | Kolker et al. | 324/551 |
| 2011/0273183 A1 * | 11/2011 | Shea | 324/536 |
| 2011/0295558 A1 * | 12/2011 | Fish et al. | 702/184 |

FOREIGN PATENT DOCUMENTS

| | | |
|---|---|---|
| JP | 7-63831 | 3/1995 |
| JP | 10-104325 | 4/1998 |
| JP | 2005-274440 | 10/2005 |
| JP | P2005-274440 A | 10/2005 |
| JP | 2006-38471 | 2/2006 |
| JP | 2006-98170 | 4/2006 |

OTHER PUBLICATIONS

Japanese Office Action dated Apr. 24, 2012, issued in corresponding Japanese Application No. 2009-108177 with English Translation.
Japanese Office Action dated Jun. 7, 2011, issued in corresponding Japanese Application No. 2009-108177 with English Translation.

* cited by examiner

DISCHARGE AMOUNT MEASURING DEVICE AND METHOD FOR ROTATIONAL ELECTRIC MACHINE

CROSS REFERENCE TO RELATED APPLICATION

This application is based on Japanese Patent Application No. 2009-108177 filed on Apr. 27, 2009, the disclosure of which is incorporated herein by reference in its entirety.

BACKGROUND OF THE INVENTION

1. Field of the Invention

The present invention relates to a discharge amount measuring device and method for a rotational electric machine.

2. Description of Related Art

A rotational electric machine such as an electric motor or generator includes a coil, and the coil may directly contact with a casing or core of the rotational electric machine. When the machine includes plural coils, the coils may directly contact with each other. The coil is insulated by an insulating film. However, discharge may be generated by applying a pulse voltage. If discharge is generated, the insulating film is damaged. Further, a short may be generated, if the insulating film is completely damaged. Therefore, a discharge amount or insulating performance is required to be measured.

JP-A-2006-098170 discloses a method of measuring a discharge amount. A current waveform is detected by a high frequency current transformer, and the detected waveform is filtered by a high-pass filter. Thus, only discharge pulse is extracted, and a discharge amount is calculated based on a peak value of the extracted pulse.

JP-A-2005-274440 discloses a method of measuring a discharge amount. A current waveform is detected by a current sensor, and an electromagnetic waveform is detected by an electromagnetic sensor. Fourier transform is performed relative to the current waveform and the electromagnetic waveform. A discharge amount is calculated based on a variation of a high frequency component of the Fourier transform.

JP-A-2006-038688 discloses a method of measuring a discharge amount. A discharge amount is calculated by measuring a partial discharge current, when a surge voltage is intentionally applied to a coil of a motor with a predetermined frequency 50 Hz-20 kHz by using a surge voltage generating device.

However, a frequency of a discharge pulse generated in the motor is high. Further, an impedance of the coil of the motor is complicated, because the impedance is represented by a distribution constant. Therefore, a discharge generated in the motor is easily diffused, and an amount of current flowing through a sensor may not correspond to an actual amount of the discharge. That is, the current passing through the sensor is only a part of the actual discharge amount. Thus, the discharge amount measured by using the above method is smaller than the actual discharge amount.

SUMMARY OF THE INVENTION

In view of the foregoing and other problems, it is an object of the present invention to provide a discharge amount measuring device and a discharge amount measuring method for a rotational electric machine.

According to a first example of the present invention, a discharge amount measuring device for a rotational electric machine includes a power source, a first current sensor, a calibration wire, a second current sensor and a measuring portion. The power source applies a voltage to a coil of the rotational electric machine. The first current sensor detects a current flowing through the coil. The calibration wire has an end connected to the coil. The second current sensor detects a current flowing through the calibration wire. The measuring portion is configured to form a calibration line based on a first current waveform detected by the first current sensor and a second current waveform detected by the second current sensor. The measuring portion is configured to calculate a discharge amount based on the calibration line.

Accordingly, accuracy for measuring the discharge amount can be raised.

According to a second example of the present invention, a method of measuring a discharge amount for a rotational electric machine includes an applying step, a first detecting step, a second detecting step, a forming step and a calculating step. A voltage is applied to a coil mounted to the rotational electric machine in the applying step. A current flowing through the coil is detected by a first current sensor in the first detecting step. A current flowing through a calibration wire is detected by a second current sensor in the second detecting step. The calibration wire has an end connected to the coil. A calibration line is formed based on a first current waveform detected by the first current sensor and a second current waveform detected by the second current sensor in the forming step. A discharge amount is calculated based on the calibration line in the calculating step.

Accordingly, accuracy for measuring the discharge amount can be raised.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF PREFERRED EMBODIMENT

Figure 1:
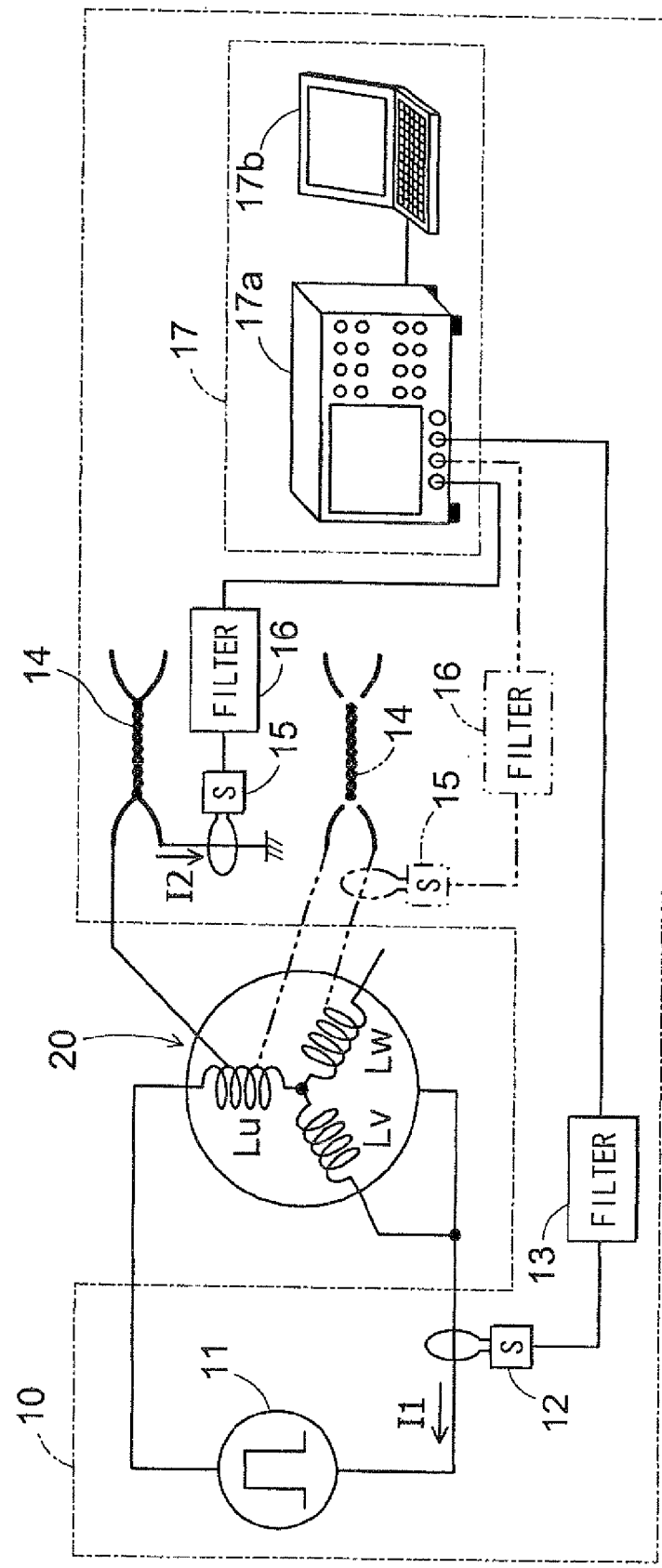
FIG. 1 is a diagram illustrating a discharge amount measuring device for a rotational electric machine according to an embodiment.

As shown in FIG. 1, a discharge amount measuring device 10 includes a pulsed power source 11, a first current sensor 12, a first high-pass filter 13, a twist pair wire 14, a second current sensor 15, a second high-pass filter 16 and a measuring portion 17. The power source 11 applies pulse voltage to coils Lu, Lv, Lw of a motor 20 corresponding to a rotational electric machine. When the pulse voltage is applied, a partial discharge is generated among the coils Lu, Lv, Lw and the ground. The partial discharge represents phenomena in which a minute electric charge is instantaneously transported when a voltage locally becomes larger than a predetermined value. A current generated by the partial discharge mainly contains high frequency component, for example, equal to or higher than 100 MHz.

The first current sensor 12 detects a first current I1 passing through the coil Lu, Lv, Lw. The second current sensor 15 detects a second current I2 passing through the wire 14. For example, a high frequency current transformer is used as the sensor 12, 15. The high-pass filter 13, 16 allows only high frequency component to pass relative to a current waveform detected by the sensor 12, 15.

The wire 14 corresponds to a calibration wire, and is arranged at a position at which the partial discharge is easily generated. For example, the wire 14 is arranged between the coil Lu and the ground, as shown in a solid line of FIG. 1, or the wire 14 is arranged between the coil Lu and the coil Lw, as shown in a double-dashed chain line of FIG. 1. When the wire 14 is arranged between the coils Lu, Lv, Lw, the coils Lu, Lv, Lw may directly contact with each other. When the wire 14 is arranged between the coil and the ground, a position of the ground is not limited. For example, the position of the ground may be a housing or frame of the motor 20, for example. The wire 14 is covered with an insulating film, and a thickness of the insulating film of the wire 14 is thinner than that of an insulating film to cover the coil Lu, Lv, Lw. Thus, the partial discharge is easily generated in the wire 14. The measuring portion 17 forms a calibration line, and measures a discharge amount based on the calibration line. The calibration line is formed based on a first waveform of the first current I1 detected by the sensor 12 and a second waveform of the second current I2 detected by the sensor 15. An amount of a discharge generated in the motor 20 is quantitatively measured based on the calibration line.

The calibration line is formed by illustrating a relationship between a peak value or area of the first waveform and a discharge amount obtained based on the second waveform, in a first example. Alternatively, the calibration line is formed by illustrating a relationship between a peak value or area of a waveform obtained by performing Fourier transform relative to the first waveform and a discharge amount obtained based on the second waveform, in a second example.

The calibration line represents a relationship between a current amount and a discharge amount, and may have a linear or curved shape. The calibration line may be formed by using a mathematical method such as a least square method or regression analysis. For example, an approximation line can be obtained by using a predetermined function such as a linear function, hyperbolic function, inverse hyperbolic function or logarithmic curve. Thus, a discharge amount can be accurately and quantitatively calculated.

The measuring portion 17 includes a current waveform analyzer 17*a* and a computer 17*b*. The analyzer 17*a* performs an analysis relative to the waveform. For example, the analyzer 17*a* calculates a peak value or area of the waveform, or performs Fourier transform relative to the waveform. When Fourier transform is performed, a peak value or area is calculated relative to a waveform obtained through the Fourier transform. The analyzer 17*a* inputs analysis result into the computer 17*b*, and the computer 17*b* forms a calibration line based on the analysis result. The computer 17*b* may display the calibration line. Further, the computer 17*b* quantitatively calculates a discharge amount based on the calibration line, and displays the calculated discharge amount.

Figure 2:
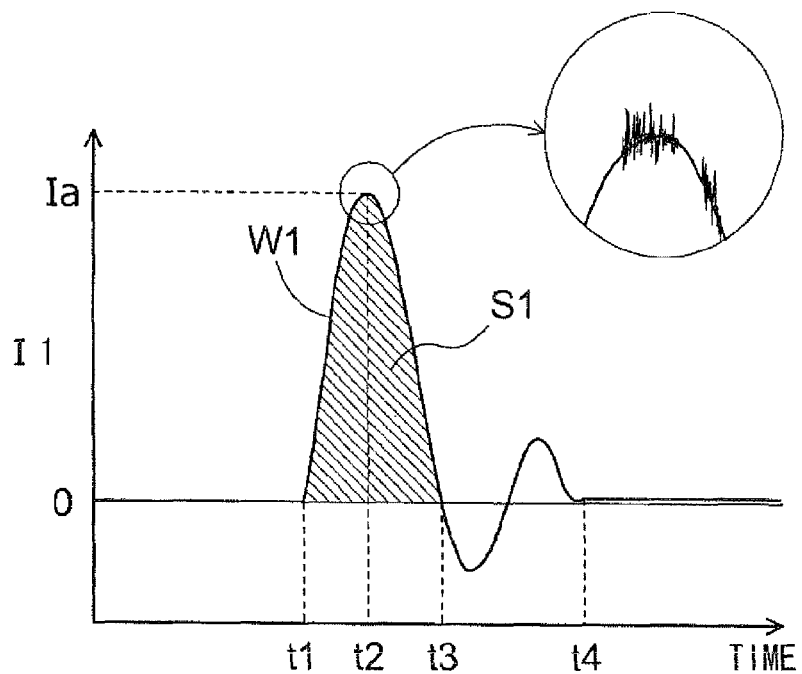
FIG. 2 is a graph illustrating a waveform of a first current flowing through a coil of the rotational electric machine.
Figure 3:
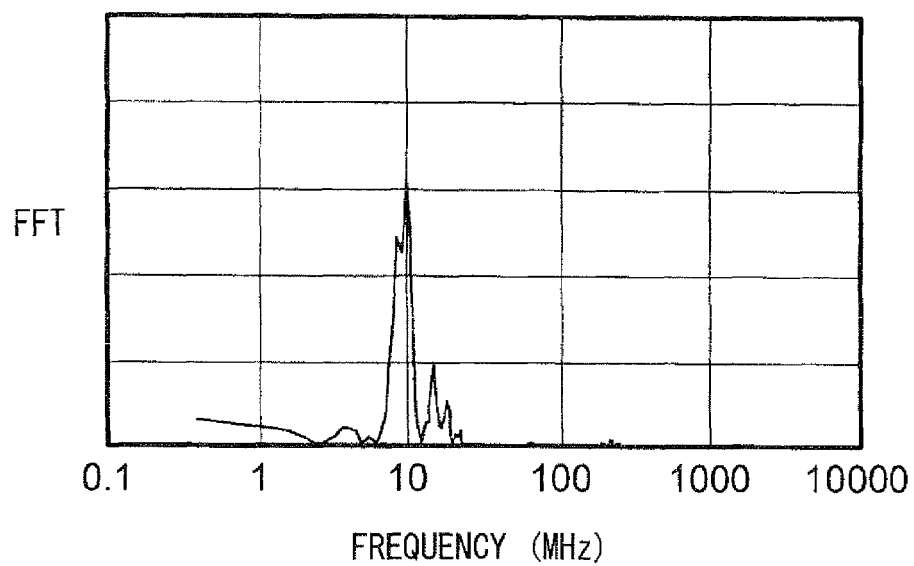
FIG. 3 is a graph illustrating a relationship between a frequency and a FFT value in an actual case having no discharge.
Figure 4:
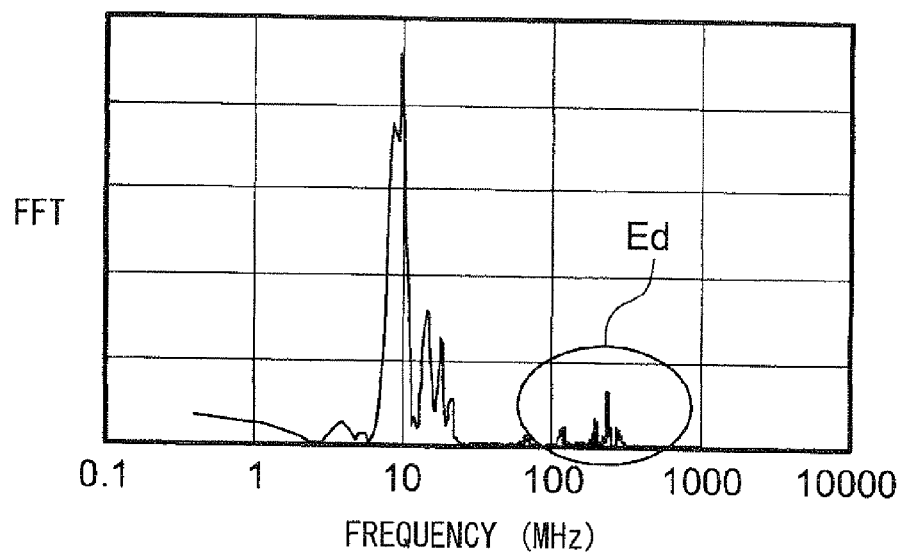
FIG. 4 is a graph illustrating a relationship between a frequency and a FFT value in an actual case having discharge.
Figure 5:
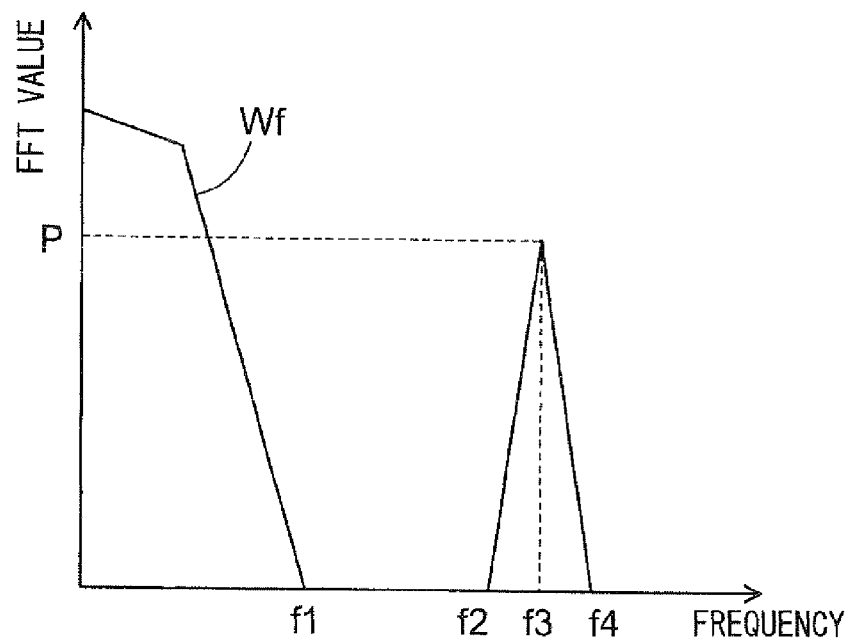
FIG. 5 is a graph illustrating a relationship between a frequency and a FFT value in a case of FIG. 2.
Figure 6:
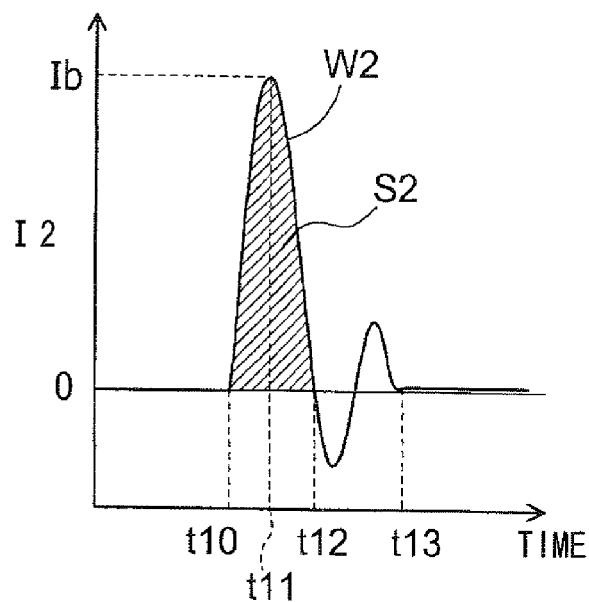
FIG. 6 is a graph illustrating a waveform of a second current flowing through a calibration wire of the discharge amount measuring device.

A relationship between a current waveform and a discharge amount will be described with reference to FIGS. 2-6. FIG. 2 illustrates a first waveform W1 of the first current I1 flowing through the coil Lu, Lv, Lw. FIG. 5 illustrates a waveform obtained by performing Fourier transform relative to the first waveform W1 of FIG. 2. FIG. 6 illustrates a second waveform W2 of the second current I2 flowing through the wire 14. FIG. 3 illustrates an observed waveform when no discharge is generated. FIG. 4 illustrates an observed waveform when discharge is generated.

As shown in FIG. 2, the first current waveform W1 is detected by the sensor 12, when a pulse voltage is applied to the motor 20 from the power source 11. A lateral axis of FIG. 2 represents a time, and a vertical axis of FIG. 2 represents a current value of the first current I1. The current value is varied from zero to a peak value Ia in a time range t1-t3. The current value becomes stable, and has a predetermined value after a time t4. The first current I1 has the peak value Ia at a time t2, and has an area S1 in the time range t1-t3. A size of the area S1 represents a phase current flowing through the coil Lu, Lv, Lw of the motor 20. A high frequency component slightly overlaps with the waveform W1, and represents a discharge current. Because a part of the partial discharge generated in the coil Lu, Lv, Lw is diffused, the discharge current represents an undiffused part of the partial discharge. The high frequency component is represented by a FFT waveform Wf of FIG. 5.

FIGS. 3, 4 illustrates a waveform obtained by performing Fourier transform relative to the actual first current waveform W1. Partial discharge is not generated in FIG. 3, and partial discharge is generated in FIG. 4. A lateral axis of FIGS. 3, 4 represents a frequency, and a vertical axis of FIGS. 3, 4 represents a FFT value. When FIG. 3 and FIG. 4 are compared, only FIG. 4 shows a variation of the FFT value in a frequency range Ed such as 100-500 MHz. Therefore, a high frequency component equal to or higher than 100 MHz is used for measuring a discharge amount.

FIG. 5 shows the FFT waveform Wf obtained by performing Fourier transform relative to the first current waveform W1 of FIG. 2. A lateral axis of FIG. 5 represents a frequency, and a vertical axis of FIG. 5 represents a FFT value. A low frequency component is represented by a range equal to or lower than a frequency f1 such as 10 MHz, and a high frequency component is represented by a frequency range f2-f4 such as 100-500 MHz. As shown in FIG. 5, the FFT value has a peak value P at a frequency f3 such as 300 MHz. The peak value P can be accurately calculated, and the calculated peak value P is used for forming a calibration line.

As shown in FIG. 6, the second current waveform W2 is detected by the sensor 15, when a pulse voltage is applied to the motor 20 from the power source 11. The second current waveform W2 represents an example of discharge waveform relative to a single pulse. A lateral axis of FIG. 6 represents a time, and a vertical axis of FIG. 6 represents a current value of the second current I2. The current value is varied from zero to a peak value Ib in a time range t10-t12. The current value becomes stable, and has a predetermined value after a time t13. A time length of the range t10-t13 is about one tenth of a time length of the range t1-t4 of FIG. 2. The second current I2 has the peak value Ib at a time t11, and has an area S2 in the time range t10-t12. A size of the area S2 is approximately equal to an electric charge amount of the partial discharge generated in the coil Lu, Lv, Lw of the motor 20. That is, the area S2 is approximately equal to a discharge amount of the partial discharge generated in the coil Lu, Lv, Lw of the motor 20. The area S2 can be accurately calculated, and the calculated area S2 is used for forming a calibration line.

A process of quantitatively calculating a discharge amount by using the device 10 will be described with reference to FIGS. 7-10.

Figure 7:
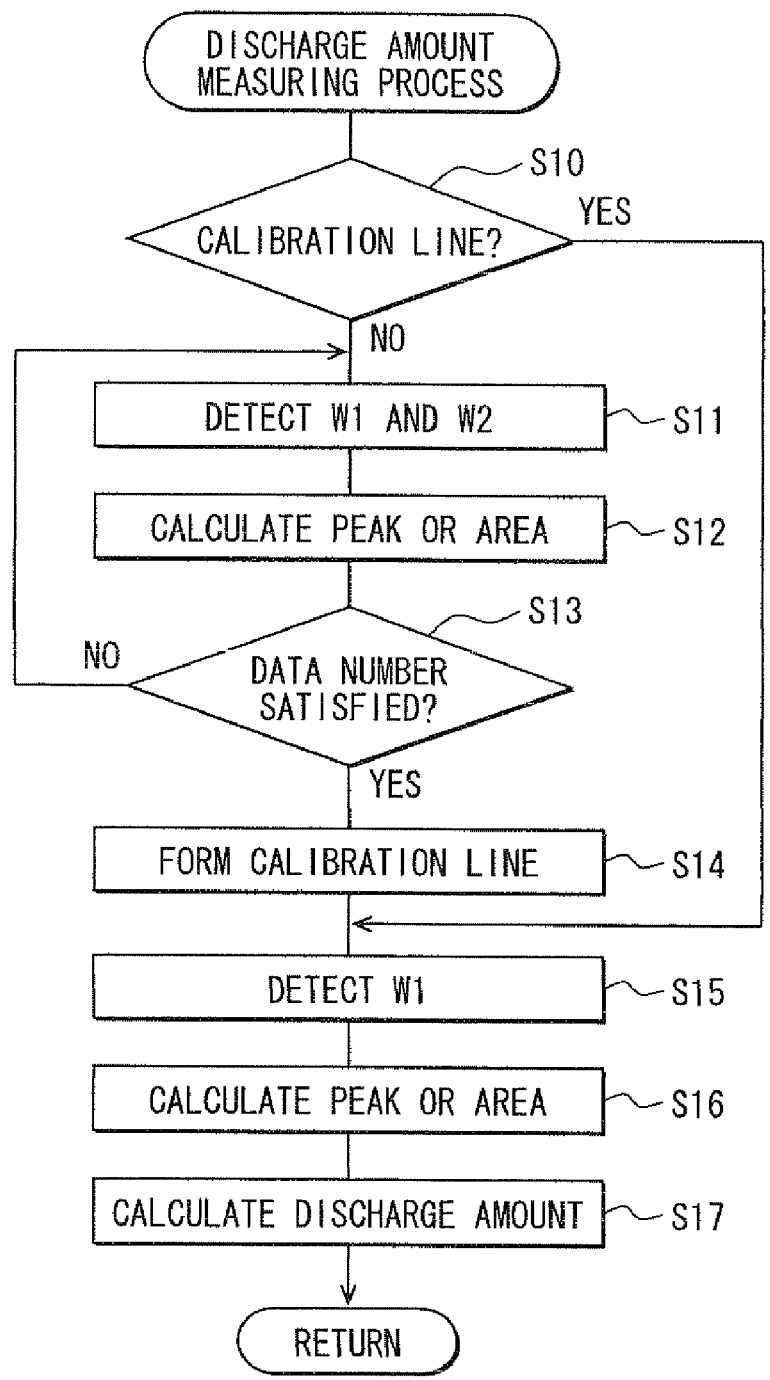
FIG. 7 is a flowchart illustrating a process of measuring a discharge amount.

As shown in FIG. 7, a process of measuring a discharge amount includes a current detecting step S11, a calibration line forming step S12, S13, S14, and a measuring step S15, S16.

At S10, a calibration line is determined to exist or not, relative to the motor 20 corresponding to a rotational electric machine. If the calibration line exists (YES), the first current waveform W1 is detected, at S15. If the calibration line does not exist (NO), the current detecting step S11 and the calibration line forming step S12, S13, S14 are performed.

At S11, the first current waveform W1 is detected by the sensor 12, and the second current waveform W2 is detected by the sensor 15. The second current waveform W2 is detected, in a state that the wire 14 is arranged at four positions shown in symbols ◇, ○, Δ, □ of FIG. 8, for example. The position ◇ is defined between the U-phase coil Lu and the ground such as a casing of the motor 20. The position ○ is defined between the U-phase coil Lu and the V-phase coil Lv. The position Δ is defined between a first location of the V-phase coil Lv and a second location of the V-phase coil Lv, which are directly contact with each other. The position □ is defined between the V-phase coil Lv and the W-phase coil Lw.

As the number of the wires 14 is increased, the calibration line can more accurately represent characteristics of the motor 20 to be measured. In a case that a position of the coil and a contact position of the coils can be specified by a specifying device, a connection or contact is automatically performed by using an actuator or robot hand, for example, and a current waveform is detected. The specifying device may be a device for analyzing an image imaged by an imaging portion such as CCD camera. Alternatively, the specifying device may be a device having a teaching function to specify a position of the connection or contact.

At S12 of FIG. 7, information necessary for forming the calibration line is obtained based on the current waveforms W1, W2. Specifically, the necessary information may be the peak value Ia, Ib, P or the area S1, S2.

At S13, when the number of data necessary for forming the calibration line is not satisfied (NO), steps S11 and S12 are repeated. The number of the necessary data is not limited, and may be as much as possible.

Figure 9:
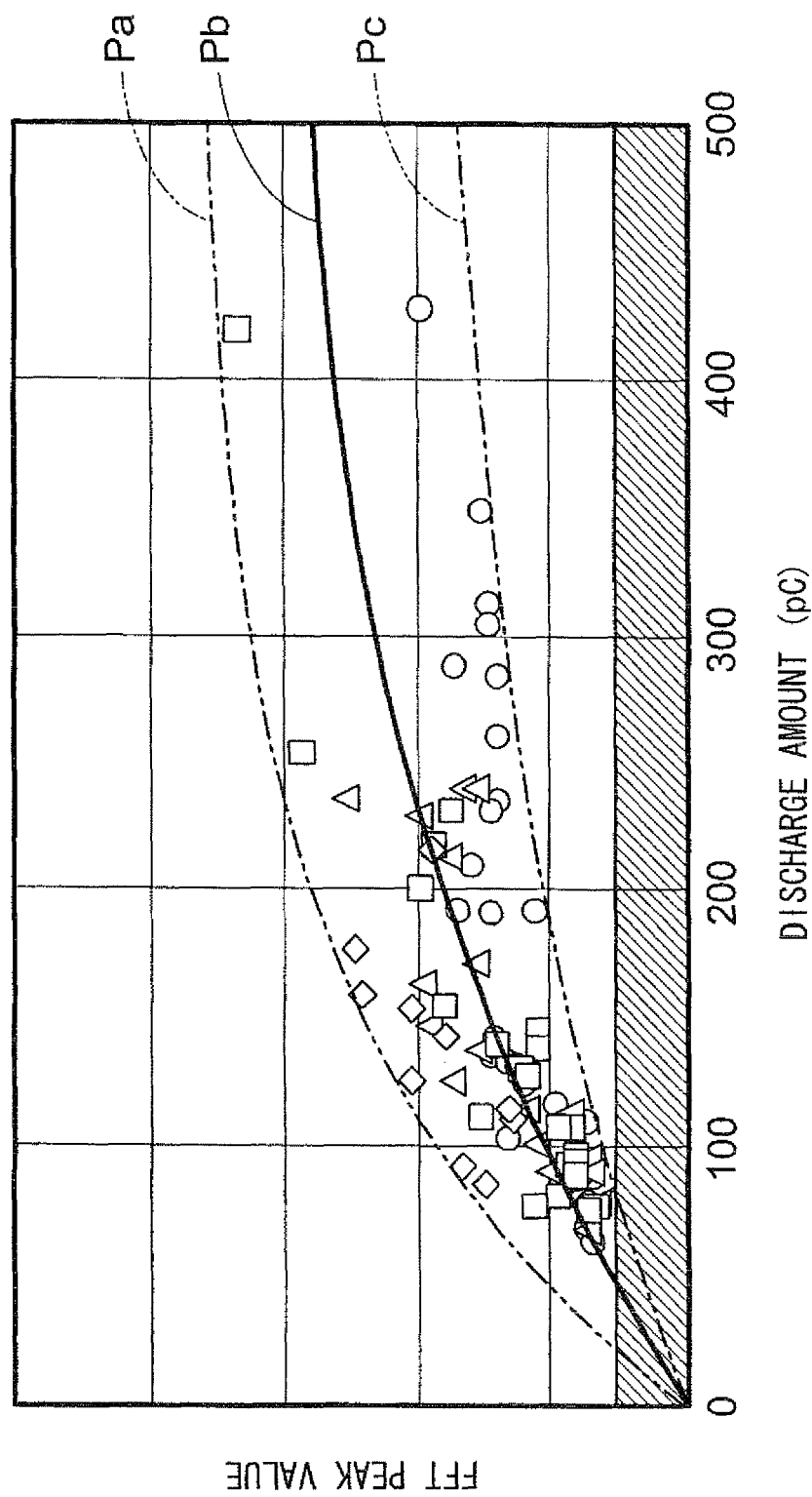
FIG. 9 is a graph illustrating a calibration line.

At S14, a calibration line is formed based on the information, when the number of the necessary data is satisfied (YES at S13). The calibration line may be displayed at S14, if necessary. The calibration line may be formed by using a mathematical method such as a least square method, dispersion analysis, regression analysis, multiple regression analysis or logistic regression. At least one approximation method is used. For example, an approximation line can be obtained by using a predetermined function such as a linear function, hyperbolic function, inverse hyperbolic function or logarithmic curve. FIG. 9 shows a graph illustrating the information obtained at S12 and a calibration line Pb formed at S14.

A vertical axis of FIG. 9 represents the peak value P of the FFT waveform W1, and a lateral axis of FIG. 9 represents the area S2 of the second current waveform W2 corresponding to an amount of the partial discharge generated in the coil. Plots of FIG. 9 are performed by using the symbols ◇, ○, Δ, □ of FIG. 8. The calibration line Pb shown in a bold line of FIG. 9 is an approximation line formed by using an inverse hyperbolic function "arccosh", for example. Data in a hatched area of FIG. 9 is defined as a noise, and is not used for forming the calibration line Pb. The calibration line Pb may be located between an upper limit line Pa and a lower limit line Pc, which are shown in a double-dashed chain line of FIG. 9.

At S15 of FIG. 7, a first current waveform W1 is detected relative to the motor 20 or other motor corresponding to an object to be measured, similarly to S11.

At S16, the peak value P of the FFT waveform Wf is calculated based on the waveform W1, similarly to S12. Alternatively, the area S2 of the FFT waveform Wf is calculated based on the waveform W1 at S16.

Figure 10:
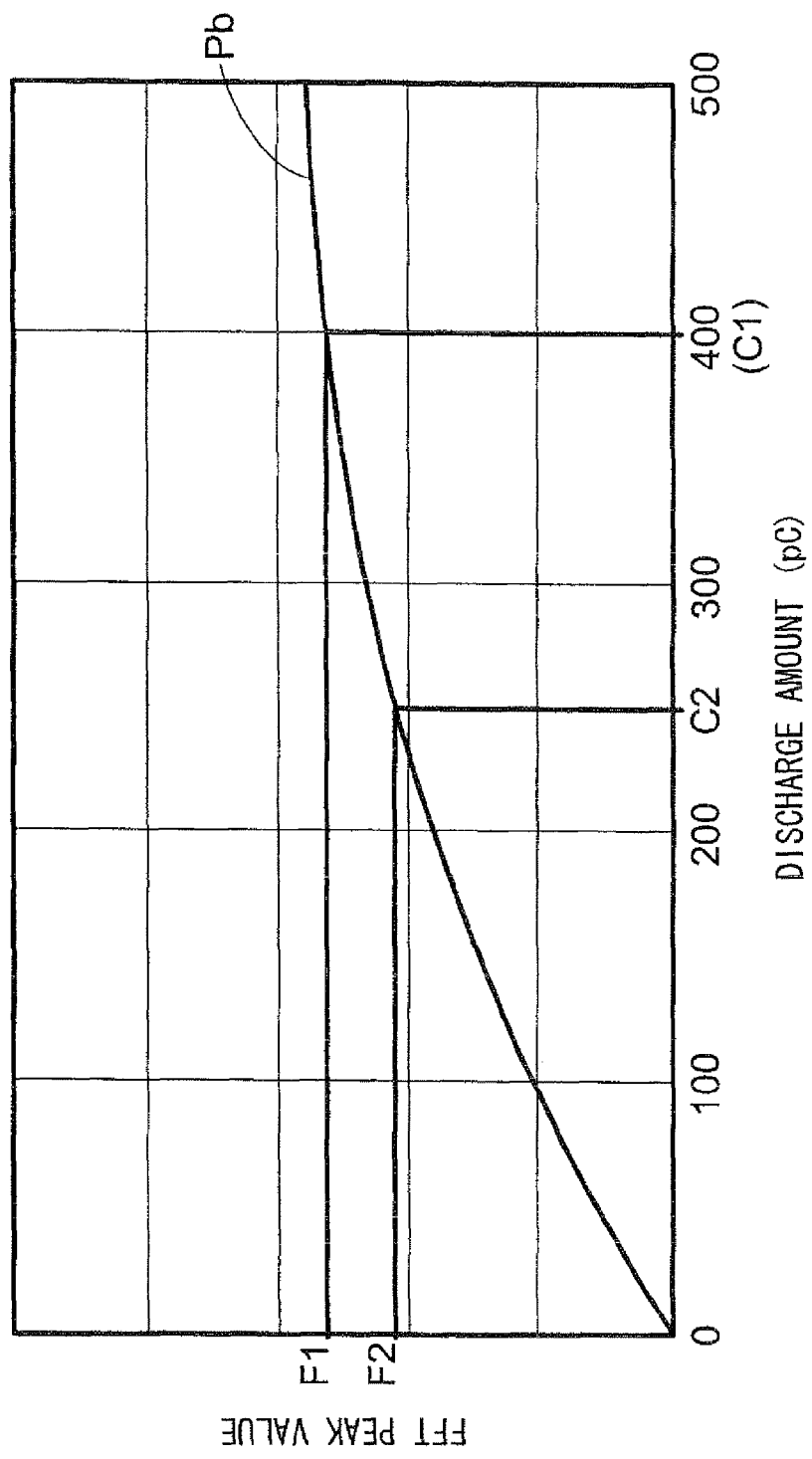
FIG. 10 is a graph illustrating a process of calculating a discharge amount based on the calibration line.

At S17, a discharge amount of the object to be measured is calculated based on the peak value P and the calibration line Pb, and the calculated discharge amount is displayed. For example, as shown in FIG. 10, when the FFT peak value P has a value of F1 in the vertical axis, the partial discharge amount has a value of C1 such as 400 pC. Similarly, when the FFT peak value P has a value of F2 in the vertical axis, the partial discharge amount has a value of C2 such as 250 pC.

Advantages of the embodiment will be described.

According to the embodiment, the calibration line Pb represents a relationship between a current waveform and a discharge amount, and the current waveform represents a state after having a diffusion of the discharge. The current waveform corresponds to the first waveform W1, and the discharge amount corresponds to the second waveform W2. Therefore, actual discharge amount can be quantitatively calculated based on the current waveform after having the diffusion of the discharge. Thus, accuracy for measuring the discharge amount can be raised.

A thickness of an insulating film covering the wire 14 is smaller than that covering the coil Lu, Lv, Lw. Therefore, discharge is easily generated in the wire 14. When the discharge amount generated in the wire 14 is quantitated, influence of diffusion of discharge generated in the coil Lu, Lv, Lw can be reduced. Thus, accuracy for measuring the discharge amount can be raised.

Figure 8:
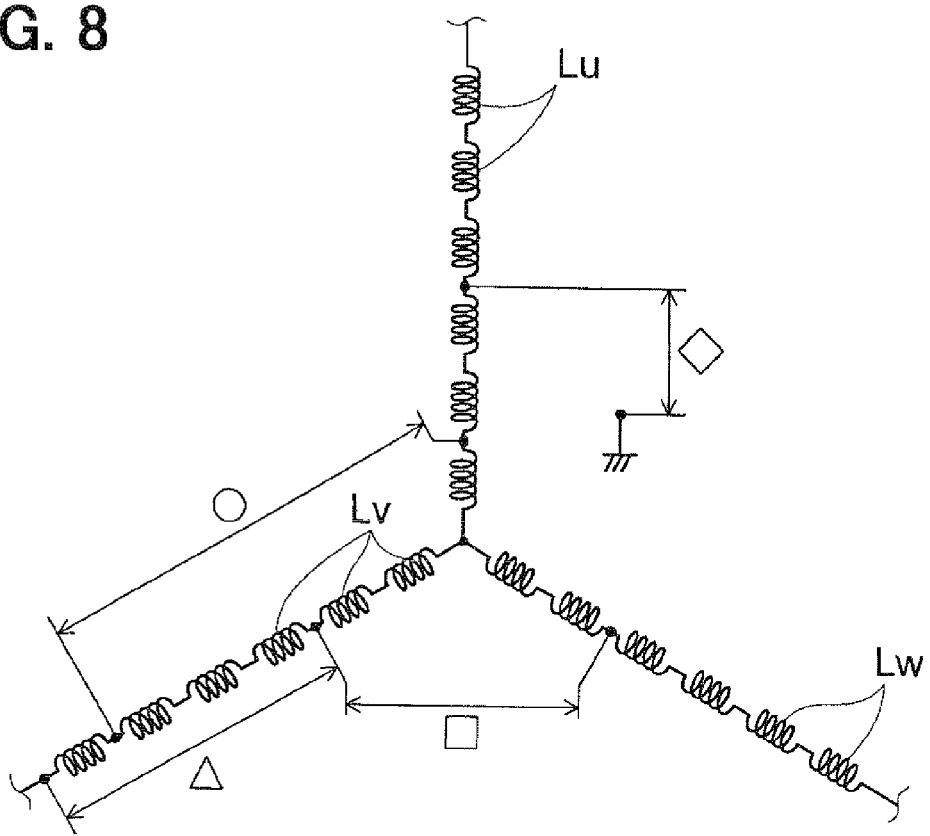
FIG. 8 is a diagram illustrating a connection example of coils of the rotational electric machine.

As shown in the symbol ◇ of FIG. 8, the wire 14 is arranged between the coil Lu and the ground such as a casing of the motor 20. Therefore, when discharge is generated between the coil Lu and the casing of the motor 20, the discharge is detected through the wire 14. Thus, accuracy for measuring the discharge amount can be raised. When the wire 14 is arranged between the coil Lv, Lw and the casing of the motor 20, the same advantage can be obtained.

As shown in the symbol ○, Δ, □ of FIG. 8, the wire 14 is arranged among the coils Lu, Lv, Lw. Therefore, when discharge is generated between the coils Lu, Lv, Lw, the discharge is detected through the wire 14. Thus, accuracy for measuring the discharge amount can be raised.

As shown in the symbol Δ of FIG. 8, the wire 14 is arranged in the coil Lv in a direct contact state. Discharge is easily generated in the direct contact state, compared with a case in which a coil is not in a contact state. Therefore, when discharge is generated in the coil Lv, the discharge is detected through the wire 14. Thus, accuracy for measuring the discharge amount can be raised.

The measuring portion 17 defines the calibration line Pb based on a relationship between the peak value P of the FFT waveform Wf and the area S2 of the waveform W2. The peak value P is obtained after the waveform W1 is made to pass through the high-pass filter 13. Because the peak value P and the area S2 can be easily and accurately calculated, the calibration line Pb can be made accurate.

Further, the waveform obtained by performing Fourier transform (FFT) mainly shows a variation generated by a discharge. Therefore, the calibration line can be made accurate. Thus, accuracy for measuring the discharge amount can be raised.

The measuring portion 17 calculates the discharge amount based on a high frequency component equal to or higher than 100 MHz. Because the discharge is easily generated in the frequency range 100-500 MHz, the calibration line Pb can be made accurate. Thus, accuracy for measuring the discharge amount can be raised.

The second current I2 flowing through the wire 14 is detected in the detecting step S11. The calibration line Pb is formed based on the waveforms W1, W2 in the calibration line forming step S12, S14. A discharge amount is calculated based on the calibration line Pb in the measuring step S15, S16. Therefore, actual discharge amount can be quantitatively calculated. Because the calibration line Pb represents a relationship between the waveform W1 after having the discharge diffusion and the discharge amount corresponding to the waveform W2, accuracy for measuring the discharge amount can be raised.

Changes and modifications are to be understood as being within the scope of the present invention as defined by the appended claims.

The rotational electric machine is a machine to which a pulse voltage is able to be applied, and is not limited to the motor 20. For example, the rotational electric machine may be a power generator, an alternating current generator for a vehicle, or a generator motor able to perform both of engine ignition and power generation. Further, the motor 20 is not limited to have three phases. The motor 20 may have two phases, or four or more phases.

The rotational electric machine is not limited to have the coils Lu, Lv, Lw. The coil may be other device activated by applying pulse voltage. For example, the other device may be a boosting transformer or a circuit coil. Because an amount of discharge generated in the other device can be quantitated, the same advantage can be obtained.

The calibration wire is not limited to the twist part wire 14. Other wire may be used as the calibration wire, and a discharge may be easily generated in the other wire, compared with the coils Lu, Lv, Lw mounted in the rotational electric machine. For example, the calibration wire may be two rectangular wirings contacting with each other. In this case, discharge is easily generated in the other wire, and an influence of the discharge diffusion can be reduced. Therefore, the same advantage can be obtained.

The measuring portion 17 is not limited to have the analyzer 17a and the computer 17b. The analyzer 17a may have a function of the computer 17b, or the computer 17b may have a function of current waveform analysis through a software. In this case, the calibration line Pb can be formed, and a discharge amount can be quantitatively calculated. Therefore, the same advantage can be obtained.

The current sensor 12, 15 is not limited to the high frequency current transformer. Alternatively, the sensor 12, 15 may be a magnetic proportional sensor, electromagnetic induction sensor, or Faraday effect sensor. The electromagnetic induction sensor has a current bus and a ring-shaped core or coil located around the current bus. A current is detected by an induced electromotive force generated by a conducting of a phase current. The Faraday effect sensor has fiber optic arranged along a magnetic field direction. When linear polarized light is incident into the fiber optic, a direction of polarized wave is rotated in proportion with strength of a magnetic field. The strength of the magnetic field is detected by measuring an angle of the rotation, and corresponds to the current. Thus, the same advantage can be obtained.

What is claimed is:

1. A discharge amount measuring device for a rotational electric machine comprising:
   a power source to apply a voltage to a coil of the rotational electric machine;
   a first current sensor to detect a current flowing through the coil;
   a calibration wire having an end connected to the coil;
   a second current sensor to detect a current flowing through the calibration wire; and
   a measuring portion configured to form a calibration line based on a first current waveform detected by the first current sensor and a second current waveform detected by the second current sensor, wherein
   the measuring portion is configured to calculate a discharge amount based on the calibration line.

2. The discharge amount measuring device according to claim 1, wherein
   the calibration wire is covered by a first insulating film,
   the coil is covered by a second insulation film, and
   the first insulating film has a thickness smaller than a thickness of the second insulating film.

3. The discharge amount measuring device according to claim 1, wherein
   the calibration wire is arranged to connect the coil and a casing of the rotational electric machine.

4. The discharge amount measuring device according to claim 1, wherein
   the coil is one of a plurality of coils, and
   the calibration wire is arranged to connect the plurality of coils.

5. The discharge amount measuring device according to claim 4, wherein
   the connected coils directly contact with each other.

6. The discharge amount measuring device according to claim 1, further comprising:
   a high-pass filter to filter the first current waveform, wherein
   the measuring portion forms the calibration line based on a relationship between a peak value or area of the filtered waveform and a discharge amount corresponding to the second current waveform.

7. The discharge amount measuring device according to claim 6, wherein
   the measuring portion performs Fourier transform relative to the first current waveform, and
   the measuring portion calculates the peak value or area based on a waveform obtained by performing Fourier transform.

8. The discharge amount measuring device according to claim 1, wherein
   the measuring portion measures the discharge amount based on a component having a frequency equal to or higher than 100 MHz.

9. A method of measuring a discharge amount for a rotational electric machine comprising:
   applying a voltage to a coil mounted to the rotational electric machine;
   detecting a current flowing through the coil by a first current sensor;
   detecting a current flowing through a calibration wire by a second current sensor, the calibration wire having an end connected to the coil;
   forming a calibration line based on a first current waveform detected by the first current sensor and a second current waveform detected by the second current sensor; and
   calculating a discharge amount based on the calibration line.

* * * * *